(12) United States Patent
Moore et al.

(10) Patent No.: US 8,679,945 B2
(45) Date of Patent: Mar. 25, 2014

(54) BACKGRIND PROCESS FOR INTEGRATED CIRCUIT WAFERS

(75) Inventors: Gregory A. Moore, Carrollton, TX (US); Tyonda Hill, Haltom City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/412,562

(22) Filed: Mar. 5, 2012

(65) Prior Publication Data

US 2012/0244655 A1 Sep. 27, 2012

Related U.S. Application Data

(60) Provisional application No. 61/449,282, filed on Mar. 4, 2011.

(51) Int. Cl.
*H01L 21/46* (2006.01)
*H01L 21/78* (2006.01)
*H01L 21/301* (2006.01)

(52) U.S. Cl.
USPC .......... 438/459; 438/460; 257/E21.237; 257/E21.599

(58) Field of Classification Search
None
See application file for complete search history.

(56) References Cited

U.S. PATENT DOCUMENTS

| | | | |
|---|---|---|---|
| 6,861,336 B1 * | 3/2005 | Hampton | 438/460 |
| 2005/0162627 A1 * | 7/2005 | Finders et al. | 355/53 |
| 2007/0023758 A1 * | 2/2007 | Tsurume et al. | 257/66 |
| 2008/0261381 A1 * | 10/2008 | Akiyama et al. | 438/459 |
| 2011/0308739 A1 * | 12/2011 | McCutcheon et al. | 156/766 |

FOREIGN PATENT DOCUMENTS

JP 2001-021873 * 1/2001 ............ G02F 1/1333

OTHER PUBLICATIONS

Inventor, Ricky Alan Jackson, U.S. Appl. No. 13/411,861 entitled "Cavity Process Etch Undercut Monitor,".
Inventor, Ricky Alan Jackson, U.S. Appl. No. 13/411,871 entitled "Cavity Open Process to Improve Undercut,".
Inventor, Ricky Alan Jackson, U.S. Appl. No. 13/411,849 entitled "Infrared Sensor Design Using an Epoxy Film as an Infrared Absorption Layer,".
Inventor; Rick L. Wise, U.S. Appl. No. 13/412,563 entitled "Extended Area Cover Plate for Integrated Infrared Sensor.".

* cited by examiner

*Primary Examiner* — Zandra Smith
*Assistant Examiner* — Pamela E Perkins
(74) *Attorney, Agent, or Firm* — Alan A. R. Cooper; W. James Brady, III; Frederick J. Telecky, Jr.

(57) ABSTRACT

An integrated circuit is formed by coating a top surface of a wafer that has been processed through all integrated circuit chip manufacturing steps prior to backgrind with photoresist, applying backgrind tape over a top surface of the photoresist, backgrinding a back surface of the wafer to a specified thickness, removing the backgrind tape from the top surface of the photoresist, and removing the photoresist. The surface of the integrated circuit and any devices that may be bonded to the surface of the integrated circuit are protected by the photoresist layer during removal of the backgrind tape.

20 Claims, 4 Drawing Sheets

BACKGRIND PROCESS FOR INTEGRATED CIRCUIT WAFERS

CROSS-REFERENCE TO RELATED APPLICATIONS

This application claims the benefit of priority under U.S.C. §119(e) of U.S. Provisional Application 61/449,282, filed Mar. 4, 2011, the entirety of which is herein incorporated by reference.

This invention relates to integrated sensors. More particularly, this invention relates to an improved backgrind process for integrated circuit wafers.

BACKGROUND

When the backgrind tape is pulled off the upper surface of an integrated circuit, pieces of the top dielectric layer may be pulled out causing ripouts which decreases yield. In addition when backgrind tape is pulled off the upper surface of an integrated circuit to which another device has been bonded prior to backgrind, the device may stick to the backgrind tape and be removed.

An integrated infrared (IR) sensor chip with a sensor cover 34 which is attached with adhesive to the top surface of the integrated infrared sensor chip is used to illustrate a conventional backgrind process but an integrated circuit with another device attached to the surface prior to backgrind may also be used. The integrated infrared (IR) sensor in FIG 1 consists of sensors 24 and 26 which are embedded within dielectric layers 28 over the semiconductor substrate 20 and whose electrical characteristics change in proportion to the amount of incident IR radiation. The IR detection devices 24 and 26 may be thermocouples. In a typical integrated IR sensor, some of the IR detection devices 24 may be suspended over a cavity 22 to thermally isolate them from the thermally conductive substrate 20. Other IR detection devices 26 may be thermally coupled with the thermally conductive substrate 20 to be used as controls. The IR detection sensitive device 26 that is thermally coupled to the substrate remains at the substrate reference temperature whereas the IR detection device 24 suspended above the cavity and thermally decoupled from the substrate either increases or decreases in temperature as the IR radiation intensity either increases or decreases.

A dielectric layer 28 such as silicon dioxide or silicon nitride or multiple layers of one or both covers the integrated IR sensor chip. Via openings 30 filled with a metallic material provide electrical contact to the substrate 20. Etchant openings 32 that extend through the dielectric 28 over the cavity 22 enable etchant to reach the substrate 20 and to etch the substrate 20 forming a cavity 22 which thermally isolates sensor 24 from the substrate 20. A sensor cover 34 may be attached to the integrated IR sensor chip over the openings 32 to prevent solvents and debris from subsequent processing steps such as backgrind and wafer sawing from getting into the cavity. The sensor cover 34 may be an epoxy film which is laminated to the surface of the integrated sensor chip.

A typical backgrind process to thin the substrate 20 is shown in FIGS. 2A and 2B. As shown in FIG 2A, backgrind tape 36 is applied to the topside of the wafer containing the integrated sensor chip to hold the wafer in place during the backgrind process. After the substrate 20 is background to a specified thickness, the backgrind tape 36 is removed by carefully peeling it off. As shown in FIG 2B, in some instances the window cover 34 may also come off during this tape removal process decreasing yield. In addition, the etchant holes 32 through the dielectric that is suspended above the cavity 22 reduce the strength of the dielectric making it more fragile. On occasion, part of the dielectric 38 may also break off and be removed along with the backgrind tape during the detaping process. When the dielectric 38 breaks, rework to salvage the sensor to preserve yield is impossible.

SUMMARY

An integrated circuit is formed by coating a top surface of a wafer that has been processed through all integrated circuit chip manufacturing steps prior to backgrind with photoresist, applying backgrind tape over a top surface of the photoresist, backgrinding a back surface of the wafer to a specified thickness, removing the backgrind tape from the top surface of the photoresist, and removing the photoresist. The surface of the integrated circuit and any devices that may be bonded to the surface of the integrated circuit are protected by the photoresist layer during removal of the backgrind tape.

DETAILED DESCRIPTION OF EXAMPLE EMBODIMENTS

The term "integrated sensor" refers to a sensor which is embedded in an integrated circuit chip during the manufacture of the integrated circuit chip. For example, an integrated IR sensor chip may contain transistors, capacitors, and resistors in addition to IR sensitive thermopiles.

The term "integrated sensor chip" refers to an integrated circuit chip which contains an integrated sensor.

During a conventional backgrind process of an integrated circuit wafer, backgrind tape which has an adhesive coating is applied to the top side of the wafer to hold the wafer in place during the backgrind process. After the wafer is background, the tape is carefully peeled off. In some cases the tape adhesive may be sufficiently strong to remove a piece of the topmost layer of the integrated circuit causing a ripout as the tape is removed. This is especially problematic for integrated sensor chips which have devices attached to the surface. For example, this may be problematic for integrated sensor chips which have sensor windows or sensor covers adhesively bonded to the surface.

Figure 3:
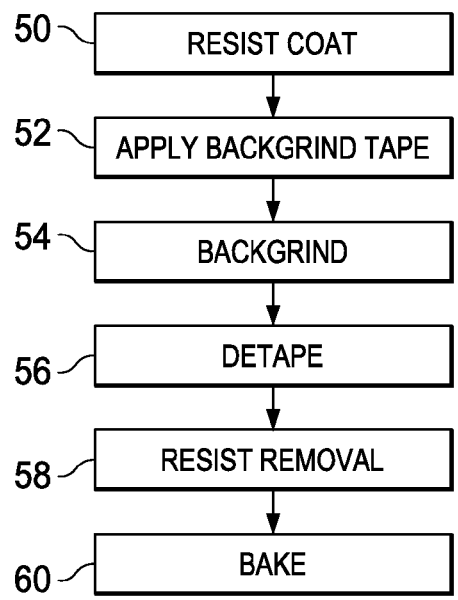
FIG. 3 is a flow diagram of a backgrind process flow according to principles of the invention.
Figure 2A:
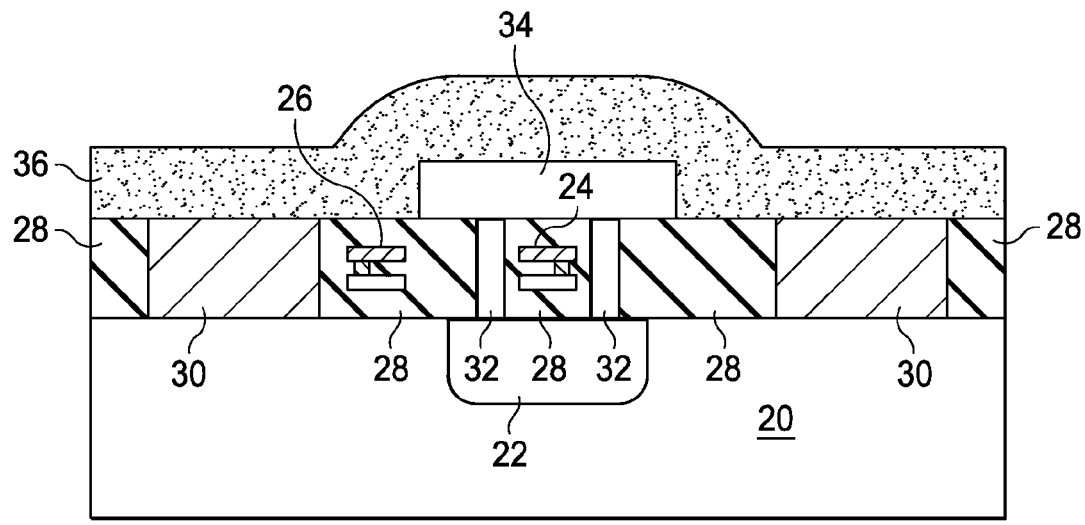
FIGS. 2A and 2B (Prior art) are cross-sections of an integrated circuit sensor chip illustrating the steps in a conventional backgrind process flow.
Figure 2B:
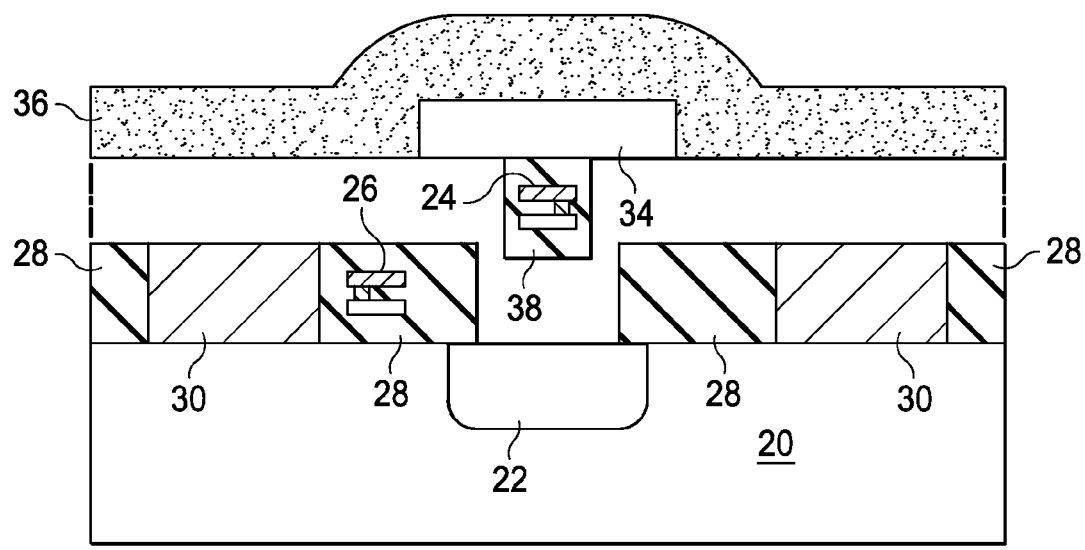

An embodiment of a backgrind process flow which eliminates ripout and sensor cover delamination issues is illustrated in the flow diagram in FIG. 3 and in cross sections illustrating the process flow in FIGS. 4A through 4E. Although an integrated circuit IR sensor is used to illustrate the embodiments, the process may be used with any integrated circuit which may suffer yield loss due to ripouts of the top dielectric layer or suffer yield loss due to delamination of a device such as a sensor cover or window which is bonded to the surface of the chip prior to application of the backgrind tape.

Figure 1:
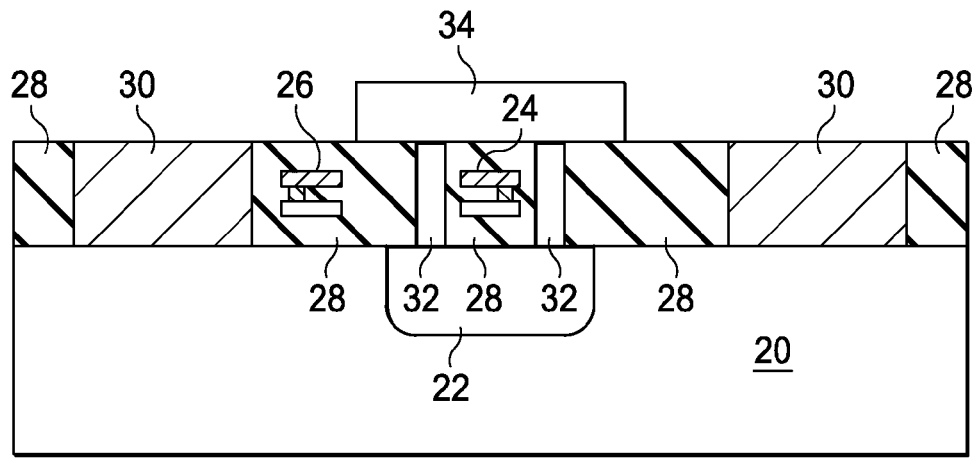
FIG. 1 (Prior Art) is a cross-section of an integrated infrared sensor chip.
Figure 4A:
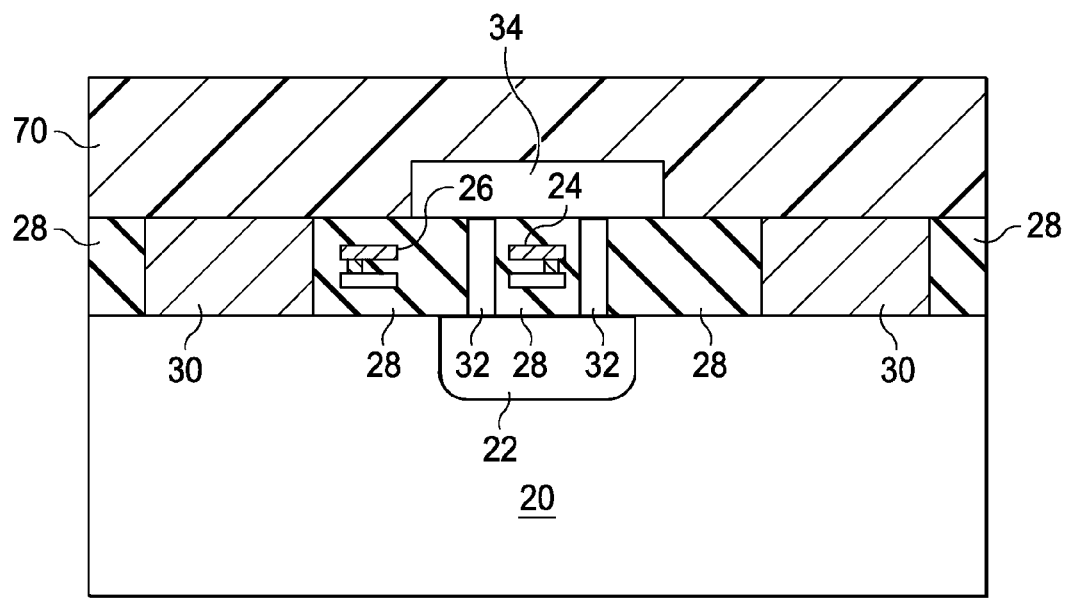
FIG. 4A through 4E are cross-sections illustrating an improved backgrind process flow for an integrated sensor chip according to principles of the invention.

The first step 50 in the embodiment backgrind process flow in FIG. 3 and illustrated in the cross section in FIG. 4A is to coat the surface of the integrated circuit wafer such as the chip shown in FIG. 1 with photoresist 70. The photoresist 70 may be a conventional photoresist coated with conventional photoresist coater. In an example embodiment, AZP4K-AP photoresist with a thickness of about 0.15 um is spin coated onto the surface of the integrated circuit wafer and is followed with a bake at about 130° C. for about 120 sec.

Figure 4B:
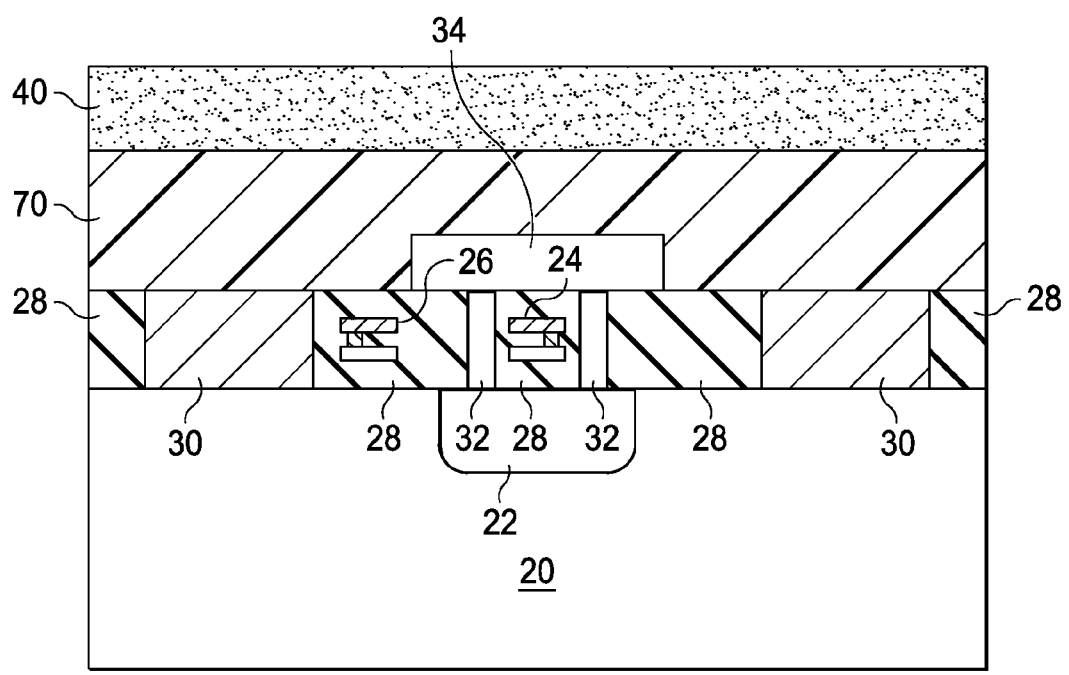

The second step 52 in the embodiment backgrind process flow in FIG. 3 and illustrated in the cross section in FIG. 4B is to apply backgrind tape 40 over the photoresist layer 70.

Figure 4C:
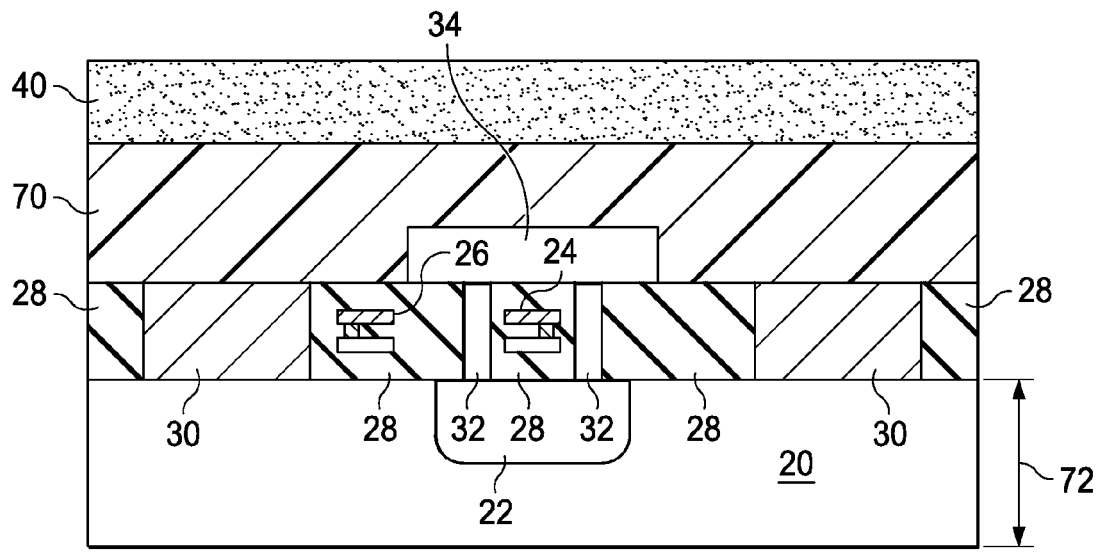

The third step 54 in the embodiment backgrind process flow in FIG. 3 and illustrated in the cross section in FIG. 4C is to backgrind the backside of the integrated circuit wafer to a specified substrate 20 thickness 72.

Figure 4D:
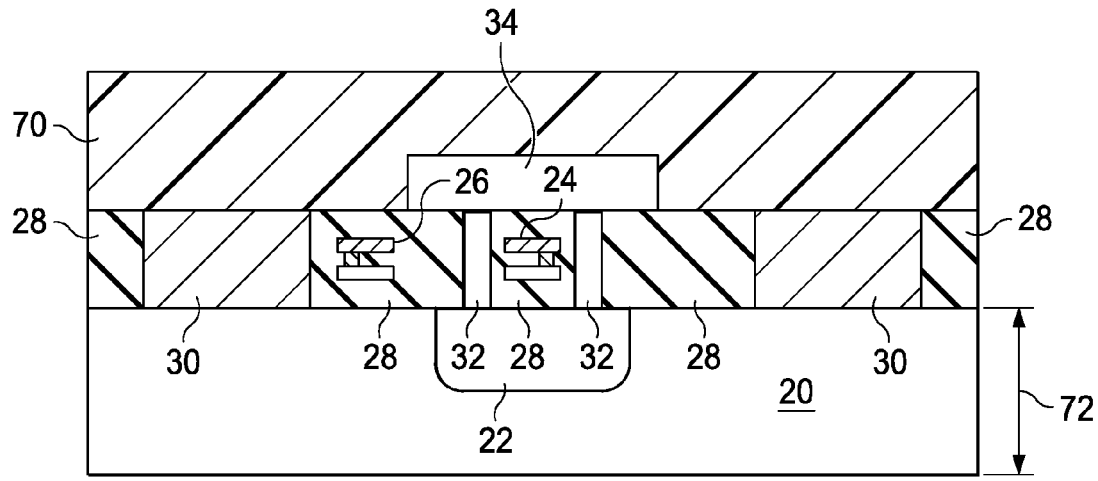

The fourth step 56 in the embodiment backgrind process flow in FIG. 3 and illustrated in the cross section in FIG. 4D is to remove the backgrind tape 40 (detape) from the photoresist layer 70. The adhesive on the backgrind tape 40 may be sufficiently strong to cause ripouts in the underlying photoresist layer 70 as the backgrind tape 40 is removed. Even with some removal of the photoresist 70 during the detaping process, the surface of the integrated circuit chip and any devices that may be bonded to the surface of the integrated circuit chip are protected by the remaining photoresist layer 70 and remain intact.

Figure 4E:
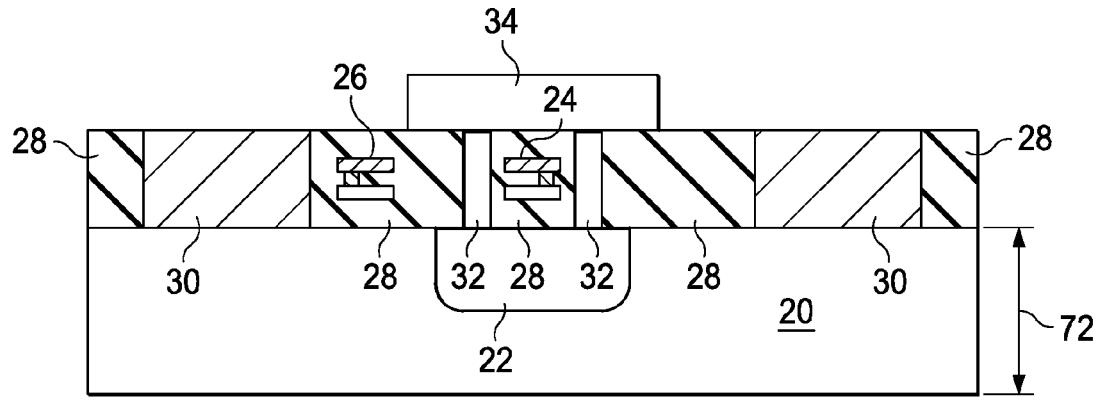

The fifth step 58 in the embodiment backgrind process flow in FIG. 3 and illustrated in the cross section in FIG. 4E is to remove the photoresist 70. The photoresist 70 is removed from the surface of integrated circuits using standard semiconductor processing. Photoresist may be removed by a solvent resist strip or may be removed by ashing followed by a solvent rinse. In an example embodiment process flow the photoresist is removed by using UPSI550 solvent.

The final step 60 in the embodiment backgrind process flow in FIG. 3 is to bake the integrated circuit wafer to evaporate any remaining solvent. In an embodiment process flow the integrated sensor wafer is baked in an inert ambient at about 175° C. for about 70 minutes.

Although an integrated circuit IR sensor is used to illustrate the embodiments any similar devices which has a window cover or other device bonded may benefit from this embodiment. In addition, any integrated circuit device that may suffer yield loss due to ripout of the top layer during the backgrind detaping process may also benefit.

Those skilled in the art to which this invention relates will appreciate that my other embodiments and variations are possible within the scope of the claimed invention.

What is claimed is:

1. A process of forming an integrated circuit, comprising the steps:
   providing a wafer containing chips of said integrated circuit which has been processed through all integrated circuit chip manufacturing steps prior to backgrind;
   coating a top surface of said wafer with photoresist;
   applying backgrind tape over a top surface of said photoresist;
   backgrinding a back surface of said wafer to a specified thickness;
   removing said backgrind tape from said top surface of said photoresist wherein at least some of said photoresist is removed during said removal; wherein when said at least of some of said photoresist is removed, the surface of the integrated circuit care protected by the remaining photoresist layer and remain intact; and
   removing said photoresist through use of a solvent.

2. The process of claim 1 further comprising baking said wafer.

3. The process of claim 2 where said bake is performed in an inert ambient at a temperature of about 130° C. for a time of about 120 sec.

4. The process of claim 1 where said integrated circuit chip is an integrated sensor chip where said integrated sensor chip has a sensor cover which is bonded with an adhesive to a top surface of said integrated circuit chip.

5. The process of claim 4 where said integrated sensor chip is an integrated infrared sensor chip.

6. A process of forming an integrated sensor chip, comprising the steps:
   providing a wafer containing integrated sensor chips which has been processed through all integrated sensor chip manufacturing steps prior to backgrind including the adhesive bonding of a window or sensor cover to a top surface of said integrated sensor chip;
   coating a top surface of said wafer with photoresist;
   applying backgrind tape over a top surface of said photoresist;
   backgrinding a back surface of said wafer to a specified thickness;
   removing said backgrind tape from said top surface of said photoresist; wherein at least some of said photoresist is removed during said removal; wherein when said at least of some of said photoresist is removed, the surface of the integrated circuit care protected by the remaining photoresist layer and remain intact; and
   removing said photoresist through use of a solvent.

7. The process of claim 6 further comprising baking said wafer.

8. The process of claim 7 where said bake is performed in an inert ambient at a temperature of about 175° C. for a time of about 70 minutes.

9. The process of claim 6 where said integrated sensor chip is an integrated infrared sensor chip.

10. A process of forming integrated infrared sensor chips, comprising the steps:
    providing a wafer containing said integrated infrared sensor chips which has been processed through all integrated infrared sensor chip manufacturing steps prior to backgrind including the adhesive bonding of an infrared sensor cover to a surface of said integrated infrared sensor chip;
    coating a top surface of said wafer with photoresist;
    applying backgrind tape over a top surface of said photoresist;
    backgrinding a back surface of said wafer to a specified thickness;
    removing said backgrind tape from said top surface of said photoresist;
    wherein at least some of said photoresist is removed during said removal; wherein when said at least of some of said photoresist is removed, the surface of the integrated circuit care protected by the remaining photoresist layer and remain intact; and
    removing said photoresist from said top surface of said wafer through use of a solvent.

11. The process of claim 10 further comprising baking said wafer.

12. The process of claim 11 where said bake is performed in an inert ambient at a temperature of about 175° C. for a time of about 70 min.

13. The process of claim 10 where said integrated circuit chip is an integrated sensor chip where said integrated sensor chip has a sensor cover which is bonded with an adhesive to a top surface of said integrated circuit chip.

14. The process of claim 13 where said integrated sensor chip is an integrated infrared sensor chip.

15. The process of claim 10 further comprising baking said wafer, where said bake is performed in an inert ambient at a temperature of about 175° C. for a time of about 70 min.

16. The process of claim 15 where said integrated circuit chip is an integrated sensor chip where said integrated sensor chip has a sensor cover which is bonded with an adhesive to a top surface of said integrated circuit chip.

17. The process of claim 16 where said integrated sensor chip is an integrated infrared sensor chip.

18. The process of claim 10, wherein said solvent is a UPSI550 solvent.

19. The process of claim 10, wherein said baking substantially evaporates any remaining solvent.

20. The process of claim 10, wherein the baking occurs in an ambient termperature.

* * * * *